United States Patent
Yeddula et al.

(10) Patent No.: US 12,027,745 B2
(45) Date of Patent: Jul. 2, 2024

(54) HYBRID COUPLER AND METHOD FOR MANUFACTURING HYBRID COUPLERS

(71) Applicant: CommScope Technologies LLC, Hickory, NC (US)

(72) Inventors: Kamalakar Yeddula, Nandyala (IN); NBVS Krishna, Pamarru (IN); Rakesh Kalwani, Margao (IN); Kumara Swamy Kasani, Godavarikhani (IN)

(73) Assignee: CommScope Technologies LLC, Hickory, NC (US)

( * ) Notice: Subject to any disclaimer, the term of this patent is extended or adjusted under 35 U.S.C. 154(b) by 0 days.

(21) Appl. No.: 18/333,655

(22) Filed: Jun. 13, 2023

(65) Prior Publication Data
US 2024/0047844 A1     Feb. 8, 2024

Related U.S. Application Data

(60) Provisional application No. 63/395,928, filed on Aug. 8, 2022.

(51) Int. Cl.
*H01P 5/18* (2006.01)
*H01P 3/08* (2006.01)
(Continued)

(52) U.S. Cl.
CPC ............. *H01P 5/16* (2013.01); *H01P 3/08* (2013.01); *H01Q 9/16* (2013.01); *H05K 1/0237* (2013.01)

(58) Field of Classification Search
CPC ......... H01P 5/12–18; H01P 3/08; H01Q 1/38; H01Q 9/16
See application file for complete search history.

(56) References Cited

U.S. PATENT DOCUMENTS 10,811,754 B2 * 10/2020 Wang ................. H01P 5/188
2021/0378091 A1   12/2021 Wang et al.
(Continued)

FOREIGN PATENT DOCUMENTS

CN    209001107 U   6/2019
JP    2019057768 A  4/2019
(Continued)

OTHER PUBLICATIONS

Notification of Transmittal of the International Search Report and the Written Opinion of the International Searching Authority, or the Declaration, in corresponding PCT Application No. PCT/US2023/068332 (dated Sep. 21, 2023).

*Primary Examiner* — Hasan Islam
(74) *Attorney, Agent, or Firm* — Myers Bigel, P.A.

(57) ABSTRACT

A hybrid coupler is disclosed. The hybrid coupler comprises a printed circuit board having a first metallization layer and a second metallization layer arranged below the first metallization layer. The first metallization layer comprises at least two input ports and at least two output ports. The hybrid coupler further comprises a plurality of couplers coupled adjacent to each other on the first metallization layer. Each coupler of the plurality of couplers comprises transmission traces electrically coupled with the transmission traces of an adjacent coupler and the transmission traces of the plurality of couplers extend between the input ports and the output ports of the first metallization layer. The hybrid coupler furthermore comprises a defective ground structure having a pre-defined shape defined in the second metallization layer below each coupling junction formed between the transmission traces of the plurality of couplers.

20 Claims, 13 Drawing Sheets

(51) Int. Cl.
*H01P 5/16* (2006.01)
*H01Q 9/16* (2006.01)
*H05K 1/02* (2006.01)

(56) References Cited

U.S. PATENT DOCUMENTS

2022/0190457 A1* 6/2022 Samanta ................ H01P 1/222
2023/0034066 A1* 2/2023 Varnoosfaderani ..... H01P 5/222

FOREIGN PATENT DOCUMENTS

| KR | 101604722 B1 | 3/2016 |
| KR | 101872964 B1 | 6/2018 |

* cited by examiner

HYBRID COUPLER AND METHOD FOR MANUFACTURING HYBRID COUPLERS

REFERENCE TO PRIORITY APPLICATION

This application claims priority under 35 U.S.C. § 119 to U.S. Provisional Application No. 63/395,928, filed Aug. 8, 2022, the disclosure of which is hereby incorporated herein by reference.

TECHNICAL FIELD

The present disclosure relates to communication systems and, in particular, to a hybrid coupler for a twin-beam antenna.

BACKGROUND

The information in this section merely provides background information related to the present disclosure and may not constitute prior art(s) for the present disclosure.

Cellular communications systems are used to provide wireless communications to fixed and mobile subscribers (herein "users"). A cellular communications system may include a plurality of base stations that each provide wireless cellular service for a specified coverage area that is typically referred to as a "cell." Each base station may include one or more antennas that are used to transmit radio frequency ("RF") signals to, and receive RF signals from, the users that are within the cell served by the base station. Antennas are directional devices that can concentrate the RF energy that is transmitted in certain directions (or received from those directions). The "gain" of an antenna in a given direction is a measure of the ability of the antenna to concentrate the RF energy in that particular direction. The "radiation pattern" of an antenna is compilation of the gain of the antenna across all different directions. The radiation pattern of an antenna is typically designed to service a pre-defined coverage area such as the cell, or a portion thereof, that is typically referred to as a "sector." The antenna may be designed to have maximum gain levels throughout its pre-defined coverage area, and it is typically desirable that the antenna have much lower gain levels outside of the coverage area to reduce interference between sectors/cells.

Typically, these plurality of sector antennas are configured on a tower, with the radiation beam(s) being generated by each antenna directed outwardly to serve the respective cell. Dual-beam/Twin-beam antennas (or multi-beam antennas) may be used to increase the capacity of a base station. For instance, a twin-beam antenna generates two separate antenna beams that each has a reduced size in the azimuth plane and that each point in different directions in the azimuth plane, thereby splitting a sector into two smaller sub-sectors. Many dual/multi-beam antennas employ beam-forming networks (BFN) to generate the multiple beams. The BFNs may include hybrid couplers, which are passive devices that couple defined amounts of RF signals that are input at one or more input ports into one or more output ports. Hybrid couplers are designed to equally or unequally split the power of the RF signals that are input at the one or more input ports thereof.

Known hybrid couplers employed in twin-beam antennas do not fulfil desired wide band requirements and consume high energy during operation. Also, the known hybrid couplers may not facilitate equal power distribution. One known solution to overcome said technical problems comprises integrating a 'Xinger' integrated circuit (IC) in a hybrid coupler. However, integrating a Xinger IC in a coupler increases the manufacturing cost as the material used in the Xinger IC (i.e., copper) and designing of said integrated coupler assembly are expensive. Moreover, Xinger ICs may exhibit low power handling capacity. Xinger IC is a kind of Xinger semiconductor which is small in size, and therefore it has low power handling capacity. If more power is applied, it is highly likely that the Xinger chip will become faulty. As couplers can be used in different antennas, the power handling capacity of the couplers becomes a challenge. The antennas are capable of handling load in instances where an input comes to the antenna in an indirect manner, i.e., after the phase shift. However, in case when an input is directly provided to the antenna, it becomes a challenge to handle high amount of power/load by the antenna.

Therefore, there is a need for an improved hybrid coupler that addresses at least the problems identified above and provides improved wide band operation, optimized power distribution and reduced cost of manufacturing.

SUMMARY

The one or more shortcomings of the prior art are overcome by the system as claimed, and additional advantages are provided through the provision of the system as claimed in the present disclosure. Additional features and advantages are realized through the techniques of the present disclosure. Other embodiments and aspects of the disclosure are described in detail herein and are considered a part of the claimed disclosure.

Pursuant to the embodiments of the present disclosure, in an aspect, a hybrid coupler is disclosed. The hybrid coupler comprises a printed circuit board having a first metallization layer and a second metallization layer arranged below the first metallization layer. The first metallization layer comprises at least two input ports and at least two output ports. The hybrid coupler further comprises a plurality of couplers coupled adjacent to each other on the first metallization layer. Each coupler of the plurality of couplers comprises transmission traces electrically coupled with the transmission traces of an adjacent coupler and the transmission traces of the plurality of couplers extend between the input ports and the output ports of the first metallization layer. The hybrid coupler furthermore comprises a defective ground structure having a pre-defined shape defined in the second metallization layer below each coupling junction formed between the transmission traces of the plurality of couplers.

In another non-limiting embodiment of the present disclosure, the pre-defined shape of the defective ground structure is in shape of a rectangle, rhombus, square, flare dumbbell, triangular dumbbell, circular dumbbell, square dumbbell or rectangular dumbbell.

In another non-limiting embodiment of the present disclosure, the hybrid coupler comprises four coupler units on the first metallization layer.

In another non-limiting embodiment of the present disclosure, the defective ground structure is configured to increase an electrical length of traces extending between the transmission traces for achieving uniform power distribution across a frequency band of 1.695 MHz to 2.690 MHz.

In another non-limiting embodiment of the present disclosure, the electrical length of traces extending between the transmission traces is 25 mm.

In another non-limiting embodiment of the present disclosure, the defective ground structure has a length of 9.40 mm and a width of 6.90 mm.

In another non-limiting embodiment of the present disclosure, the hybrid coupler is a 3 dB 90-degree hybrid coupler.

The hybrid coupler of the present disclosure, in which the defective ground structures are defined in the second metallization layer arranged below the first metallization layer having the plurality of couplers, eliminates the need of adding Xinger IC(s) in the coupler assembly and offers uniform power distribution in the hybrid coupler. Also, the hybrid coupler of the present disclosure provides improved wide band frequency for operation, optimized power distribution and reduced cost of manufacturing compared to the conventional hybrid couplers. Moreover, the hybrid coupler of the present disclosure is embodied as a wideband 3-dB quadrature coupler that can operate between 1.695-2.690 GHz, and provides the technical advantages of high power, 0.2 dB of insertion loss, return loss of better than 18 dB, and isolation of better than 25 dB in the frequency range from 1.695 to 2.69 GHz.

Pursuant to another aspect of the present disclosure, a method for manufacturing a hybrid coupler is disclosed. The method comprises designing a printed circuit board having a first metallization layer and a second metallization layer arranged below the first metallization layer. The first metallization layer comprises at least two input ports and at least two output ports. The method further comprises providing a plurality of couplers coupled adjacent to each other on the first metallization layer. Each coupler of the plurality of couplers comprises transmission traces electrically coupled with the transmission traces of an adjacent coupler and the transmission traces of the plurality of couplers extend between the input ports and the output ports of the first metallization layer. The method furthermore comprises defining a defective ground structure having a pre-defined shape in the second metallization layer below each coupling junction formed between the transmission traces of the plurality of couplers.

In another non-limiting embodiment of the present disclosure, defining the defective ground structure in the pre-defined shape comprises defining the defective ground structure in shape of a rectangle, rhombus, square, flare dumbbell, triangular dumbbell, circular dumbbell, square dumbbell or rectangular dumbbell.

Pursuant to yet another aspect of the present disclosure, a twin-bean antenna is disclosed. The twin-bean antenna comprises a hybrid coupler adapted to mount radiating elements thereon. The hybrid coupler comprises a printed circuit board having a first metallization layer and a second metallization layer arranged below the first metallization layer. The first metallization layer comprises at least two input ports and at least two output ports. The hybrid coupler further comprises a plurality of couplers coupled adjacent to each other on the first metallization layer. Each coupler of the plurality of couplers comprises transmission traces electrically coupled with the transmission traces of an adjacent coupler and the transmission traces of the plurality of couplers extend between the input ports and the output ports of the first metallization layer. The hybrid coupler furthermore comprises a defective ground structure having a pre-defined shape defined in the second metallization layer below each coupling junction formed between the transmission traces of the plurality of couplers.

In another non-limiting embodiment of the present disclosure, the pre-defined shape of the defective ground structure is in shape of a rectangle, rhombus, square, flare dumbbell, triangular dumbbell, circular dumbbell, square dumbbell or rectangular dumbbell.

In another non-limiting embodiment of the present disclosure, the hybrid coupler comprises four coupler units on the first metallization layer.

In another non-limiting embodiment of the present disclosure, the defective ground structure is configured to increase an electrical length of traces extending between the transmission traces for achieving uniform power distribution across a frequency band of 1.695 MHz to 2.690 MHz.

In another non-limiting embodiment of the present disclosure, the electrical length of traces extending between the transmission traces is 25 mm.

In another non-limiting embodiment of the present disclosure, the defective ground structure has a length of 9.40 mm and a width of 6.90 mm.

In another non-limiting embodiment of the present disclosure, the hybrid coupler is a 3 dB 90-degree hybrid coupler.

In another non-limiting embodiment of the present disclosure, the radiating elements are arranged in a staggered arrangement and electrically coupled to the hybrid coupler.

In another non-limiting embodiment of the present disclosure, the staggered arrangement of the radiating elements comprises horizontal layout, vertical layout, offset layout, or a combination layout thereof, of the radiating elements.

The twin-beam antenna comprising the hybrid coupler of the present disclosure, in which the defective ground structures are defined in the second metallization layer arranged below the first metallization layer having the plurality of couplers, eliminates the need of adding Xinger IC(s) in the coupler assembly and offers equal power distribution in the hybrid coupler. Also, the twin-beam antenna of the present disclosure provides improved wide band frequency for operation, optimized power distribution and reduced cost of manufacturing compared to the conventional known hybrid couplers. Moreover, in the twin-beam antenna, the hybrid coupler of the present disclosure is embodied as a wideband 3-dB quadrature coupler that can operate between 1.695-2.690 GHz, and provides the technical advantages of high power, 0.2 dB of insertion loss, return loss of better than 18 dB, and isolation of better than 25 dB in the frequency range from 1.695 to 2.69 GHz.

It is to be understood that the aspects and embodiments of the disclosure described above may be used in any combination with each other. Several of the aspects and embodiments may be combined together to form a further embodiment of the disclosure.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF FIGURES

The novel features and characteristics of the disclosure are set forth in the description. The disclosure itself, however, as well as a preferred mode of use, further objectives, and advantages thereof, will best be understood by reference to the following description of an illustrative embodiment when read in conjunction with the accompanying drawings. One or more embodiments are now described, by way of example only, with reference to the accompanying drawings wherein like reference numerals represent like elements and in which.

Figure 1:
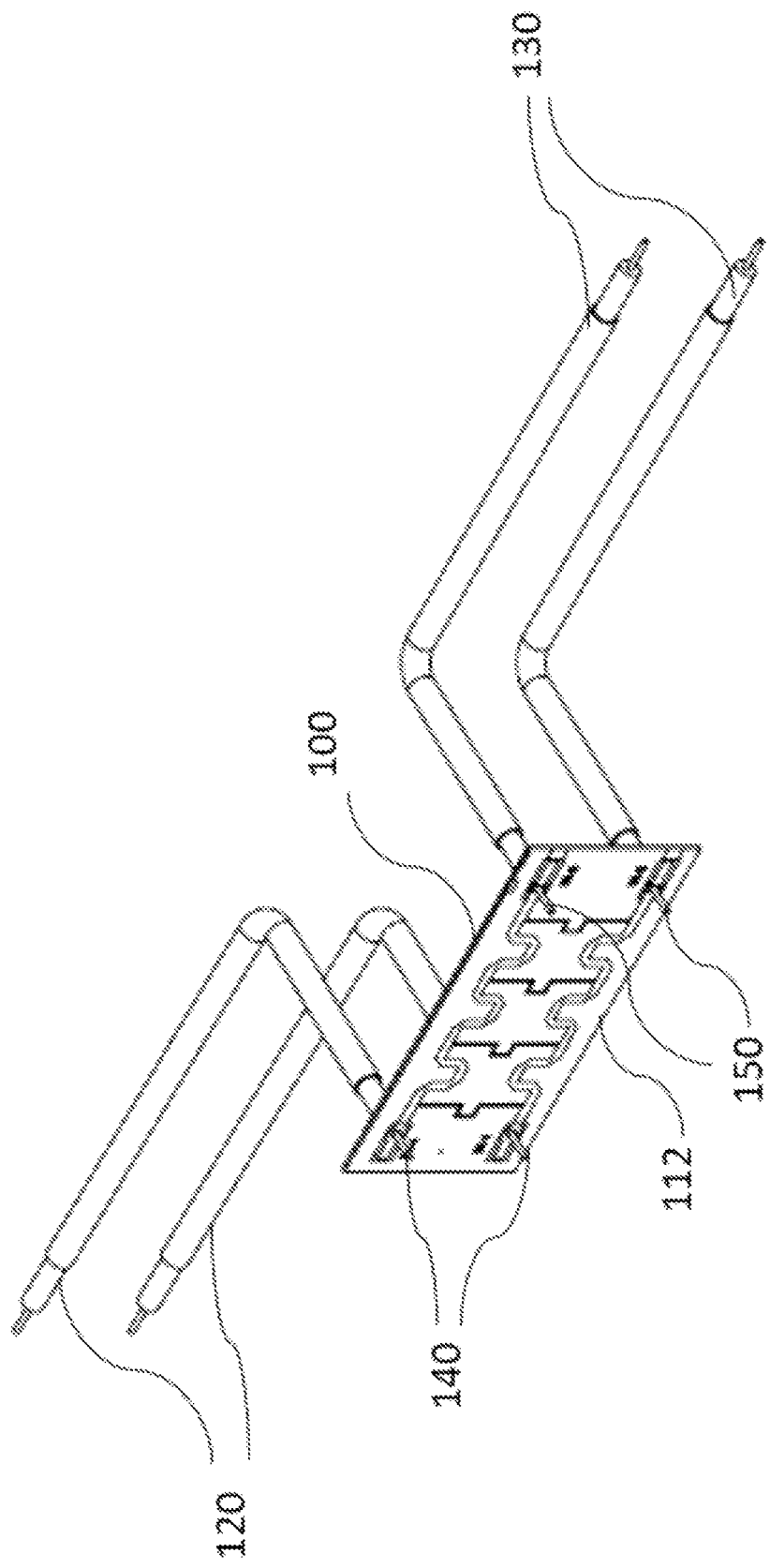
FIG. 1 is a perspective view of a hybrid coupler comprising a circuit board having a first metallization layer and a second metallization layer.

Skilled artisans will appreciate that elements in the drawings are illustrated for simplicity and have not necessarily been drawn to scale. For example, the dimensions of some of the elements in the drawings may be exaggerated relative to other elements to help to improve understanding of embodiments of the present disclosure.

DETAILED DESCRIPTION

While the disclosure is susceptible to various modifications and alternative forms, specific embodiments thereof have been shown by way of example in the figures and will be described in detail below. It should be understood, however, that it is not intended to limit the disclosure to the particular forms disclosed, but on the contrary, the disclosure is to cover all modifications, equivalents, and alternatives falling within the scope of the disclosure as defined by the appended claims.

Before describing detailed embodiments, it may be observed that the novelty and inventive step that are in accordance with the present disclosure resides in a hybrid coupler, a method for manufacturing the hybrid coupler, and a twin-bean antenna including the hybrid coupler. It is to be noted that a person skilled in the art can be motivated from the present disclosure and modify the various constructions of the hybrid coupler, the method and the twin-beam antenna. However, such modification should be construed within the scope of the present disclosure. Accordingly, the drawings are showing only those specific details that are pertinent to understanding the embodiments of the present disclosure so as not to obscure the disclosure with details that will be readily apparent to those of ordinary skill in the art having benefit of the description herein.

In the present disclosure, the term "exemplary" is used herein to mean "serving as an example, instance, or illustration." Any embodiment or implementation of the present subject matter described herein as "exemplary" is not necessarily to be construed as preferred or advantageous over other embodiments.

The terms "comprises," "comprising," or any other variations thereof, are intended to cover a non-exclusive inclusions, such that a device that comprises a list of components does not include only those components but may include other components not expressly listed or inherent to such device. In other words, one or more elements in a system or apparatus proceeded by "comprises . . . a" does not, without more constraints, preclude the existence of other elements or additional elements in the system or apparatus.

The terms like "at least one" and "one or more" may be used interchangeably or in combination throughout the description.

Pursuant to the embodiments of the present disclosure, in an aspect, a hybrid coupler is disclosed. The hybrid coupler comprises a printed circuit board having a first metallization layer and a second metallization layer arranged below the first metallization layer. The first metallization layer comprises at least two input ports and at least two output ports. The hybrid coupler further comprises a plurality of couplers coupled adjacent to each other on the first metallization layer. Each coupler of the plurality of couplers comprises transmission traces electrically coupled with the transmission traces of an adjacent coupler and the transmission traces of the plurality of couplers extend between the input ports and the output ports of the first metallization layer. The hybrid coupler further comprises a defective ground structure having a pre-defined shape defined in the second metallization layer below each coupling junction formed between the transmission traces of the plurality of couplers.

The pre-defined shape of the defective ground structure may, for example, be in shape of a rectangle, rhombus, square, flare dumbbell, triangular dumbbell, circular dumbbell, square dumbbell, rectangular dumbbell or the like. The hybrid coupler comprises four coupler units on the first metallization layer.

In an embodiment, the defective ground structure is configured to increase an electrical length of traces extending between the transmission traces for achieving uniform power distribution across a frequency band of 1.695 MHz to 2.690 MHz. The electrical length of traces extending between the transmission traces is 25 mm. Further, the defective ground structure has a length of 9.40 mm and a width of 6.90 mm. In some embodiments, the hybrid coupler is a 3 dB 90-degree hybrid coupler.

Pursuant to another aspect of the present disclosure, a method for manufacturing a hybrid coupler is disclosed. The method comprises designing a printed circuit board having a first metallization layer and a second metallization layer arranged below the first metallization layer. The first metallization layer comprises at least two input ports and at least two output ports. The method further comprises providing a plurality of couplers coupled adjacent to each other on the first metallization layer. Each coupler of the plurality of couplers comprises transmission traces electrically coupled with the transmission traces of an adjacent coupler and the transmission traces of the plurality of couplers extend between the input ports and the output ports of the first metallization layer. The method furthermore comprises defining a defective ground structure having a pre-defined shape in the second metallization layer below each coupling junction formed between two adjacent couplers of the first metallization layer. Moreover, defining the defective ground structure in the pre-defined shape may comprise defining the defective ground structure in the shape of, for example, a rectangle, rhombus, square, flare dumbbell, triangular dumbbell, circular dumbbell, square dumbbell or rectangular dumbbell.

Pursuant to yet another aspect of the present disclosure, a twin-bean antenna is disclosed. The twin-bean antenna comprises a hybrid coupler adapted to mount radiating elements thereon. The hybrid coupler comprises a printed circuit board having a first metallization layer and a second metallization layer arranged below the first metallization layer. The first metallization layer comprises at least two input ports and at least two output ports. The hybrid coupler further comprises a plurality of couplers coupled adjacent to each other on the first metallization layer. Each coupler of the plurality of couplers comprises transmission traces electrically coupled with the transmission traces of an adjacent coupler and the transmission traces of the plurality of couplers extend between the input ports and the output ports of the first metallization layer. The hybrid coupler further comprises a defective ground structure having a pre-defined shape defined in the second metallization layer below each coupling junction formed between the transmission traces of the plurality of couplers. The pre-defined shape of the defective ground structure may, for example, have the shape of a rectangle, rhombus, square, flare dumbbell, triangular dumbbell, circular dumbbell, square dumbbell or rectangular dumbbell. The hybrid coupler comprises four coupler units on the first metallization layer.

In an embodiment, the defective ground structure is configured to increase an electrical length of traces extending between the transmission traces for achieving uniform power distribution across a frequency band of 1.695 MHz to 2.690 MHz. The electrical length of traces extending between the transmission traces is 25 mm. The defective ground structure has a length of 9.40 mm and a width of 6.90 mm. Further, the hybrid coupler is a 3 dB 90-degree hybrid coupler.

In a further embodiment, the radiating elements are arranged in a staggered arrangement and electrically coupled to the hybrid coupler. The staggered arrangement of the radiating elements comprises horizontal layout, vertical layout, offset layout, or a combination layout thereof, of the radiating elements.

It is to be understood that the aspects and embodiments of the disclosure described above may be used in any combination with each other. Several of the aspects and embodiments may be combined together to form a further embodiment of the disclosure.

Reference will now be made to the exemplary embodiments of the disclosure, as illustrated in the accompanying drawings. Wherever possible same numerals will be used to refer to the same or like parts.

Embodiments of the present disclosure are described in the following paragraphs with reference to FIGS. 1 to 13. In FIGS. 1 to 13, the same element or elements which have the same or similar functions are indicated by the same reference labels.

Figure 2:
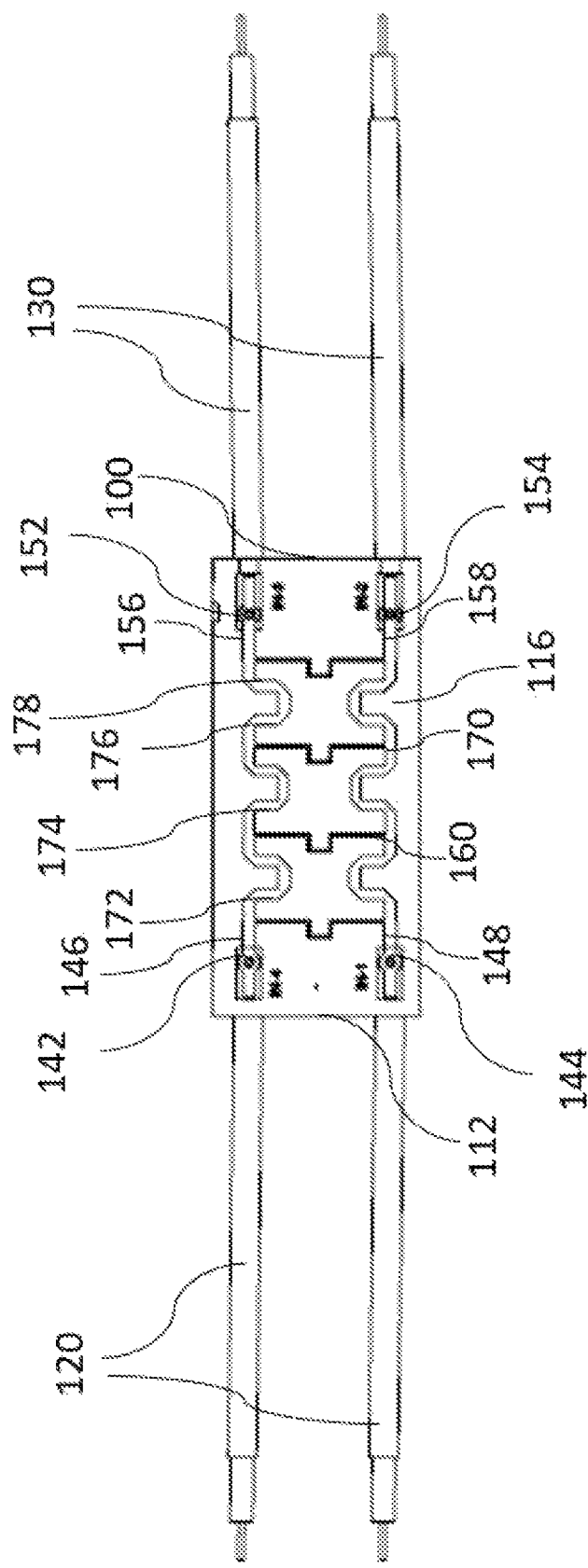
FIG. 2 is a top view of the hybrid coupler of FIG. 1 that illustrates transmission traces formed on the first metallization layer.
Figure 3:
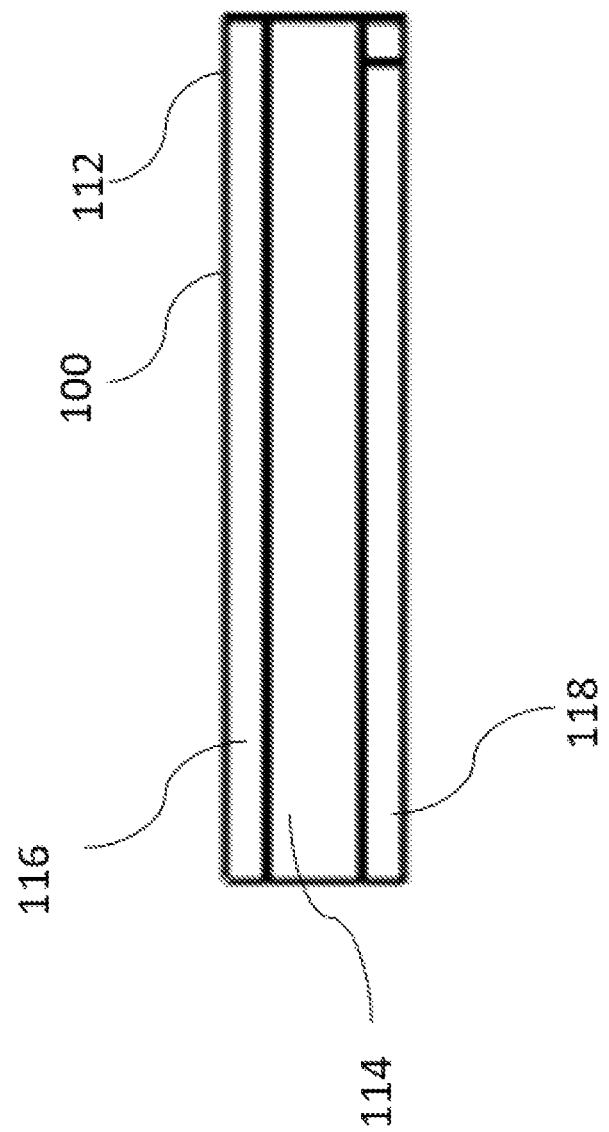
FIG. 3 is a side view of the hybrid coupler of FIG. 1 that illustrates the first metallization layer and the second metallization layer.

FIG. 1 illustrates a perspective view of a hybrid coupler (100), according to an embodiment of the present disclosure. Further, FIGS. 2 and 3 illustrate a top view and a side view, respectively, of the hybrid coupler (100) of the present disclosure. The hybrid coupler (100) may, for example, be included in a beamforming network (BFN) of a twin-beam antenna (10). As shown in FIGS. 1 and 2, the hybrid coupler (100) may comprise a printed circuit board (112). Within the scope of the present disclosure, at least two input coaxial cables (120) and two output coaxial cables (130) (or other RF transmission line structures) may be connected to the hybrid coupler (100) for carrying radio frequency (RF) signals to and from the hybrid coupler (100).

As shown in FIG. 3, the printed circuit board (112) may include a dielectric substrate (114) that has a first or "top" metallization layer (116) on a top side thereof and a second or "bottom" metallization layer (118) on a bottom side thereof. The dielectric substrate (114) may be a low-loss dielectric substrate having a suitable dielectric constant. In an exemplary embodiment, the dielectric substrate (114) may be a 30 mil ZYF300CA-C substrate. Those of skill in the art will understand that different types of dielectric substrate (114) can also be used in the present disclosure. The various components of the first and second metallization layers (116, 118) will be discussed in further detail in the subsequent paragraphs with reference to FIGS. 1 to 5.

Figure 5:
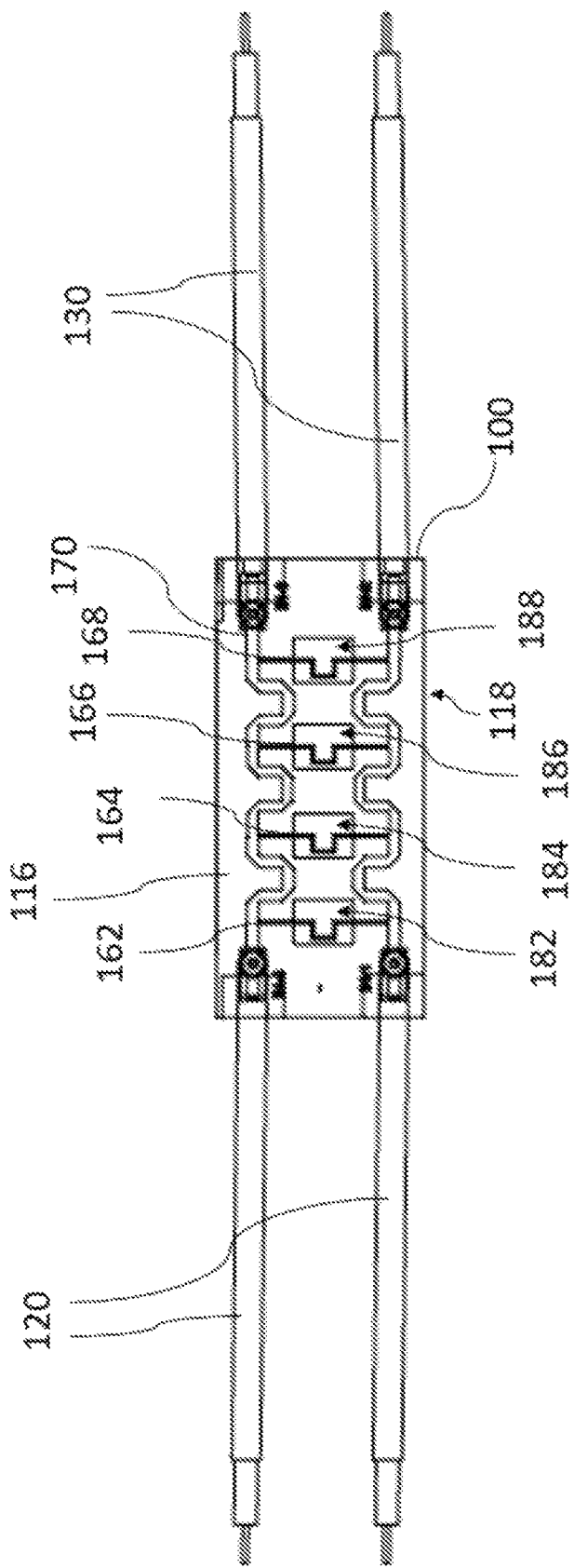
FIG. 5 is a top view of the hybrid coupler of FIG. 1 in which the first metallization layer having the transmission traces is superimposed on the second metallization layer defining the defective ground structures of a rectangle shape.

FIGS. 1, 2, 3 and 5 illustrate various structures included in the first metallization layer (116) of the printed circuit board (112) of the hybrid coupler (100) in greater detail. Within the scope of the present disclosure, the first metallization layer (116) comprises at least two input ports (140) and at least two output ports (150). As shown in FIGS. 1, 2 and 5, the first metallization layer (116) comprises two input ports (140) and two output ports (150). In an exemplary embodiment illustrated in FIGS. 2 and 5, the first metallization layer (116) comprises first and second input ports (142, 144) and first and second output ports (152, 154), each of which is implemented as a respective conductive pad. Centre conductors of the input and output coaxial cables (120, 130) may be soldered to the respective input and output ports (140, 150) for electrical transmission and/or RF signals transmission across the hybrid coupler (100). Further, the hybrid coupler (100) may comprise a first input conductive trace (146) that connects to the first input port (142) and a second input conductive trace (148) that connects to the second input port (144). In said embodiment, the first and second input conductive traces (146, 148) may each form part of the first metallization layer (116). Within the scope of the present disclosure, the first input conductive trace (146) may form part of a first input microstrip transmission line that is implemented in the printed circuit board (112), and the second input conductive trace (148) may form part of a second input microstrip transmission line that is implemented in the printed circuit board (112). The hybrid coupler (100) may further comprise a first output conductive trace (156) that connects to the first output port (152) and a second output conductive trace (158) that connects to the second output port (154). In said embodiment, the first and second output conductive traces (156, 158) may also form part of the first metallization layer (116). The first output conductive trace (156) may form part of a first output microstrip transmission line that is implemented in the printed circuit board (112), and the second output conductive trace (158) may form part of a second output microstrip transmission line that is implemented in the printed circuit board (112).

In an embodiment of the present disclosure, the input and output transmission lines may each be implemented as meandered microstrip transmission lines. This allows the physical length of the hybrid coupler (100) to be reduced while allowing the transmission lines to have desired electrical lengths. In another embodiment, the output transmission line may include a delay line (not shown) that is incorporated into the output transmission line. As a result of the addition of the delay line, the output transmission line having the delay line is electrically longer than another output transmission line.

Within the scope of the present disclosure, with reference to FIGS. 1, 2 and 5, the hybrid coupler (100) may comprise a plurality of couplers (160). The plurality of couplers (160) may be arranged adjacent to each other on the first metallization layer (116) of the printed circuit board (112). In accordance with the present disclosure, the couplers (160) are coupled to each other such that the first metallization layer (116) of the printed circuit board (112) is embodied as a cascaded arrangement of couplers (160). In said cascaded arrangement, the conductive traces (146, 148, 156, 158) or the transmission lines discussed above may be envisioned as the conductive traces formed on the plurality of couplers (160). Further, the first and second input ports (142, 144) and the first and second output ports (152, 154) of the first metallization layer (116) (discussed above) may be envisioned as the first and second input ports (142, 144) and the first and second output ports (152, 154) of the plurality of couplers (160).

Within the scope of the present disclosure, each coupler of the plurality of couplers (160) may comprise transmission traces (170), as shown in FIGS. 1, 2 and 5. The transmission traces (170) of each coupler (160) may be adapted to be electrically coupled with the transmission traces (170) of an adjacent coupler (160) such that the transmission traces (170) of the plurality of couplers (160) extend between the first and second input ports (142, 144) and the first and second output ports (152, 154) of the hybrid coupler (100). For instance, as illustrated in FIG. 5, the transmission traces (170) of a first coupler (162) of the plurality of couplers (160) are electrically coupled with the transmission traces (170) of a second coupler (164) of the plurality of couplers (160), and so on, such that the transmission traces (170) of the plurality of couplers (160) extend between the first and second input ports (142, 144) and the first and second output ports (152, 154) of the hybrid coupler (100).

In an exemplary embodiment of the present disclosure, the hybrid coupler (160) comprises four couplers arranged adjacent to each other on the first metallization layer (116), as shown in FIGS. 1, 2 and 5. In said embodiment, the first and second input ports (142, 144) connect to the first coupler (162) and the first and second output ports (152, 154) connect to the fourth coupler (168). Further, the second coupler (164) and a third coupler (166) are arranged between the first and fourth couplers (162, 168). Each of the first, second, third and fourth couplers (162, 164, 166, 168) comprises transmission traces (170) formed thereon such that the transmission traces (170) of the first coupler (162) are electrically coupled to the transmission traces (170) of the second coupler (164), which in turn are electrically coupled with the transmission traces (170) of the third coupler (166), and which are further electrically coupled with the transmission traces (170) of the fourth coupler (168), thereby electrically coupling the first and second input ports (142, 144) provided on the first coupler (162) with the first and second output ports (152, 154) provided on the fourth coupler (168) for electrical transmission and/or RF signal transmission across the hybrid coupler (100).

Additionally, the hybrid coupler (100) may further comprise transmission traces adapted to be connected to and extending between the transmission traces (170) of the plurality of couplers (160). With reference to FIG. 2, the hybrid coupler (100) may comprise a transmission trace(s) (172) adapted to be connected to and extending between the transmission traces (170) of the first coupler (162). The hybrid coupler (100) may further comprise a transmission trace(s) (174) adapted to be connected to and extending between the transmission traces (170) of the second coupler (162). Further, the hybrid coupler (100) may comprise a transmission trace(s) (176) adapted to be connected to and extending between the transmission traces (170) of the third coupler (166). Also, the hybrid coupler (100) may comprise a transmission trace(s) (178) adapted to be connected to and extending between the transmission traces (170) of the fourth coupler (168).

With reference to FIGS. 1, 3, 4 and 5, the hybrid coupler (100) further comprises the second metallization layer (118) arranged below the first metallization layer (116). The second metallization layer (118) may comprise a ground plane layer. The ground plane layer may comprise a mostly solid layer of metal that is formed on the bottom surface of the dielectric substrate (114) of the printed circuit board (112). The ground plane layer may act as the ground plane for the input and output microstrip transmission lines with the dielectric substrate (114) separating the conductive/transmission traces thereof from the ground plane layer. In an embodiment, the outer conductors of the input and output coaxial cables (120, 130) may be soldered to the ground plane layer to provide a ground reference for the ground plane layer. Within the scope of the present disclosure, and with reference to FIGS. 4 and 5, the second metallization layer (118) of the printed circuit board (112) may comprise defective ground structures (180) defined in the ground plane layer of the second metallization layer (118). In an embodiment, the defective ground structure(s) (180) may be embodied as cut-out(s) or slot(s) defined in the ground plane layer of the second metallization layer (118). In an alternate embodiment, the defective ground structure(s) (180) may be embodied as metal omitted from the ground plane layer and/or the second metallization layer (118) of the printed circuit board (112).

In accordance with the present disclosure, as shown in FIG. 5, the defective ground structure (180) is defined in the second metallization layer (118) below each coupling junction formed between the transmission traces (170) of the plurality of couplers (160) comprised in the first metallization layer (116). For instance, in the exemplary embodiment of the hybrid coupler (100) comprising four couplers (160) as shown in FIG. 5 (in which the first metallization layer (116) having the transmission traces (170) is superimposed on the second metallization layer (118) defining the defective ground structures (180)), the hybrid coupler (100) comprises one defective ground structure (180) formed at each coupling junction formed between the transmission traces (170) of the plurality of couplers (160). Specifically, as can be seen in FIG. 5, a first defective ground structure (182) is defined in the second metallization layer (118) below the coupling junction between the transmission traces (170) of the first coupler (162) of the first metallization layer (116), a second defective ground structure (184) is defined in the second metallization layer (118) below the coupling junction between the transmission traces (170) of the second coupler (164) of the first metallization layer (116), a third defective ground structure (186) is defined in the second metallization layer (118) below the coupling junction between the transmission traces (170) of the third coupler (166) of the first metallization layer (116), and a fourth defective ground structure (188) is defined in the second metallization layer (118) below the coupling junction between the transmission traces (170) of the fourth coupler (168) of the first metallization layer (116).

Figure 4:
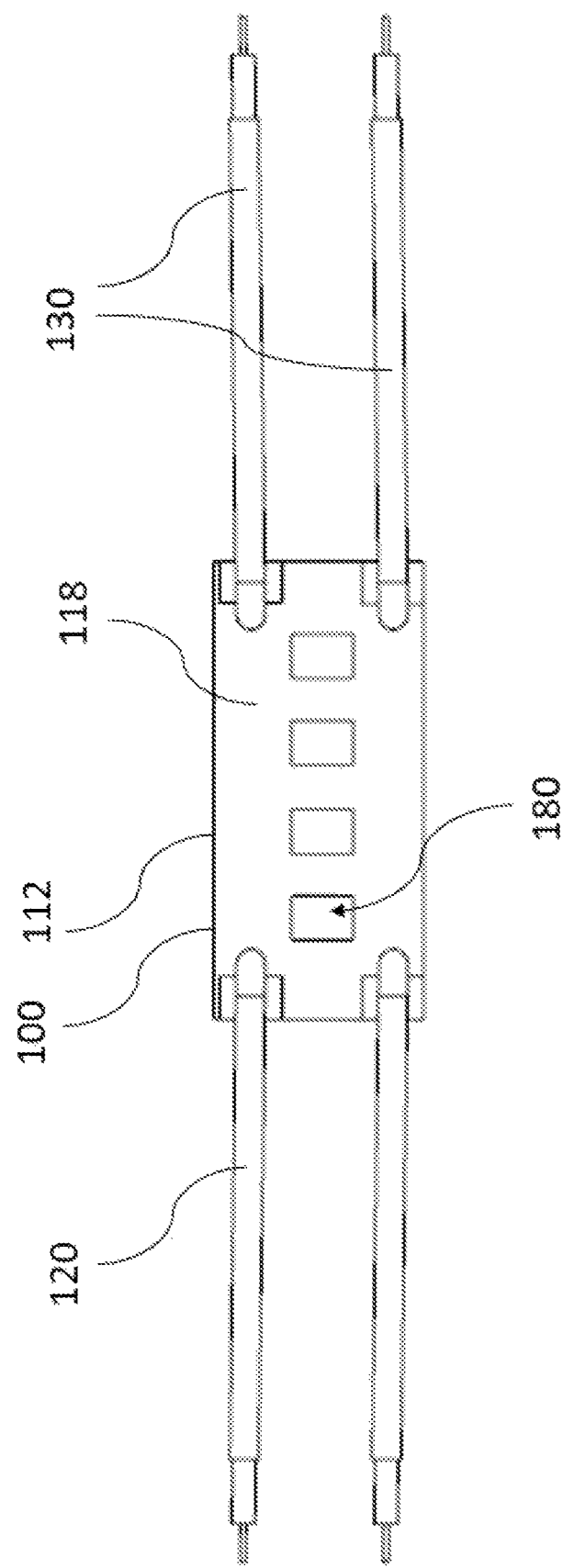
FIG. 4 is a bottom view of the hybrid coupler of FIG. 1 that illustrates defective ground structures in the second metallization layer.

Within the scope of the present disclosure, as shown in FIGS. 4 and 5, each of the defective ground structures (180) of the second metallization layer (118) is embodied to have a pre-defined shape. The pre-defined shape may so be selected such that the said shape is suitable to reduce the insertion loss in the hybrid coupler (100) during operation of the hybrid coupler (100). In the exemplary embodiment shown in FIGS. 4 and 5, each of the defective ground structures (180) in the second metallization layer (118) is embodied in a shape of a rectangle.

Figure 6:
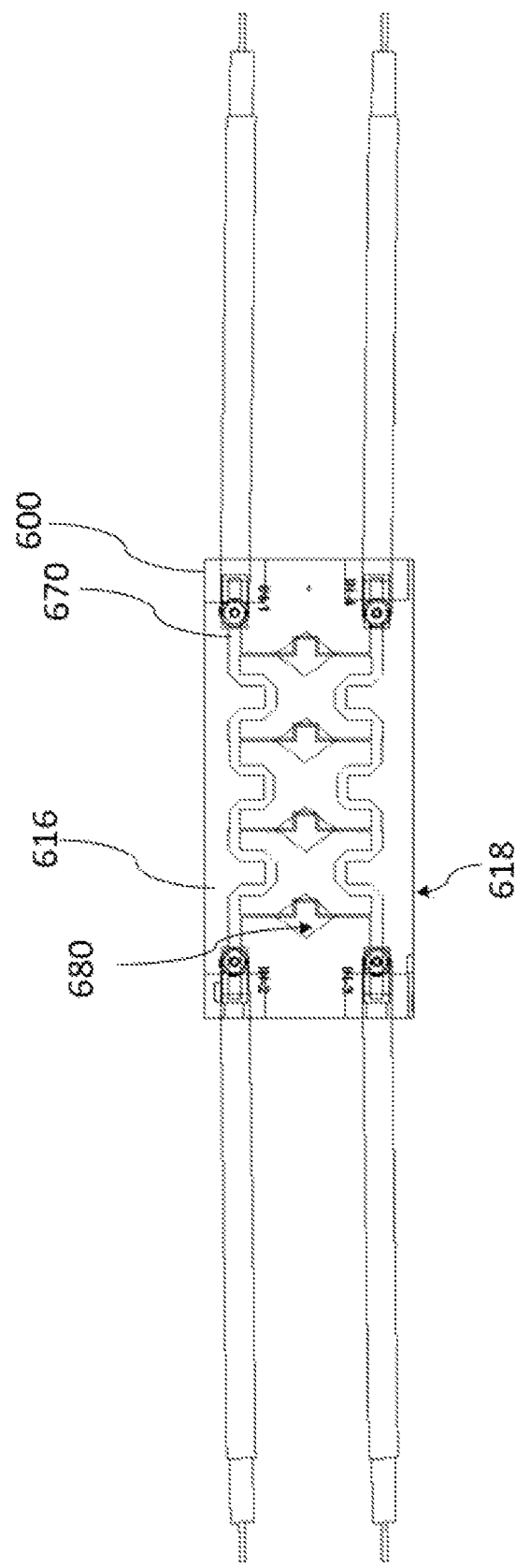
FIG. 6 is a top view of the hybrid coupler of FIG. 1 in which the first metallization layer having the transmission traces is superimposed on the second metallization layer defining the defective ground structures of a rhombus shape.
Figure 7:
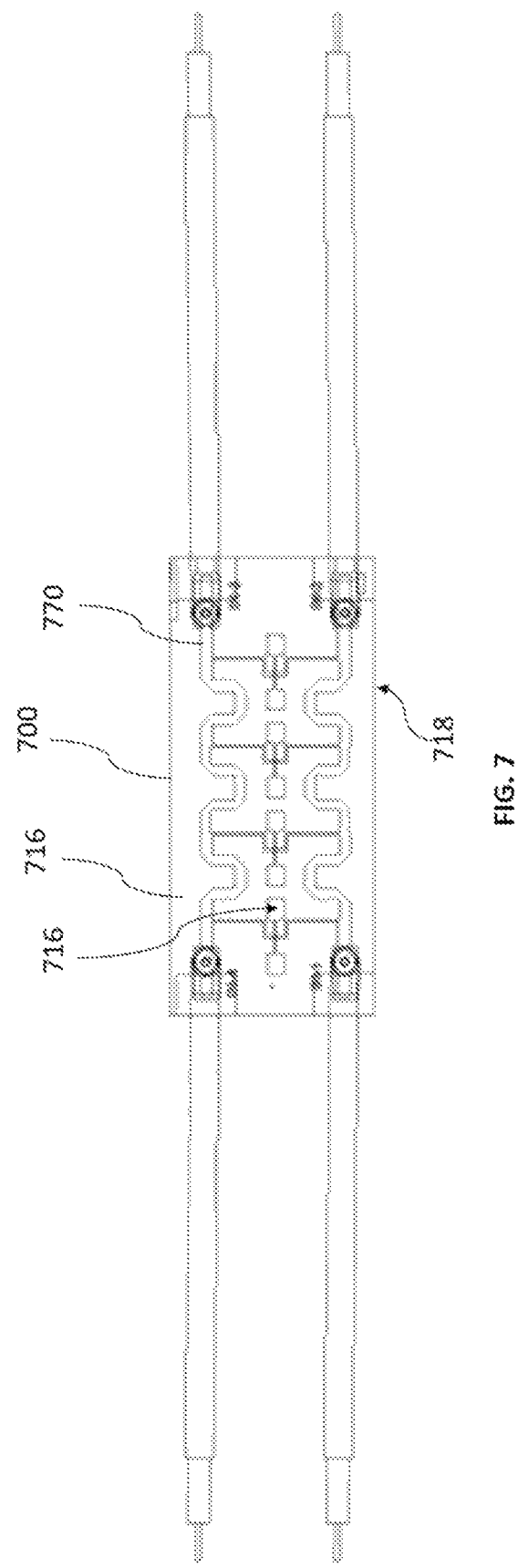
FIG. 7 is a top view of the hybrid coupler of FIG. 1 in which the first metallization layer having the transmission traces is superimposed on the second metallization layer defining the defective ground structures of a square dumbbell shape.
Figure 8:
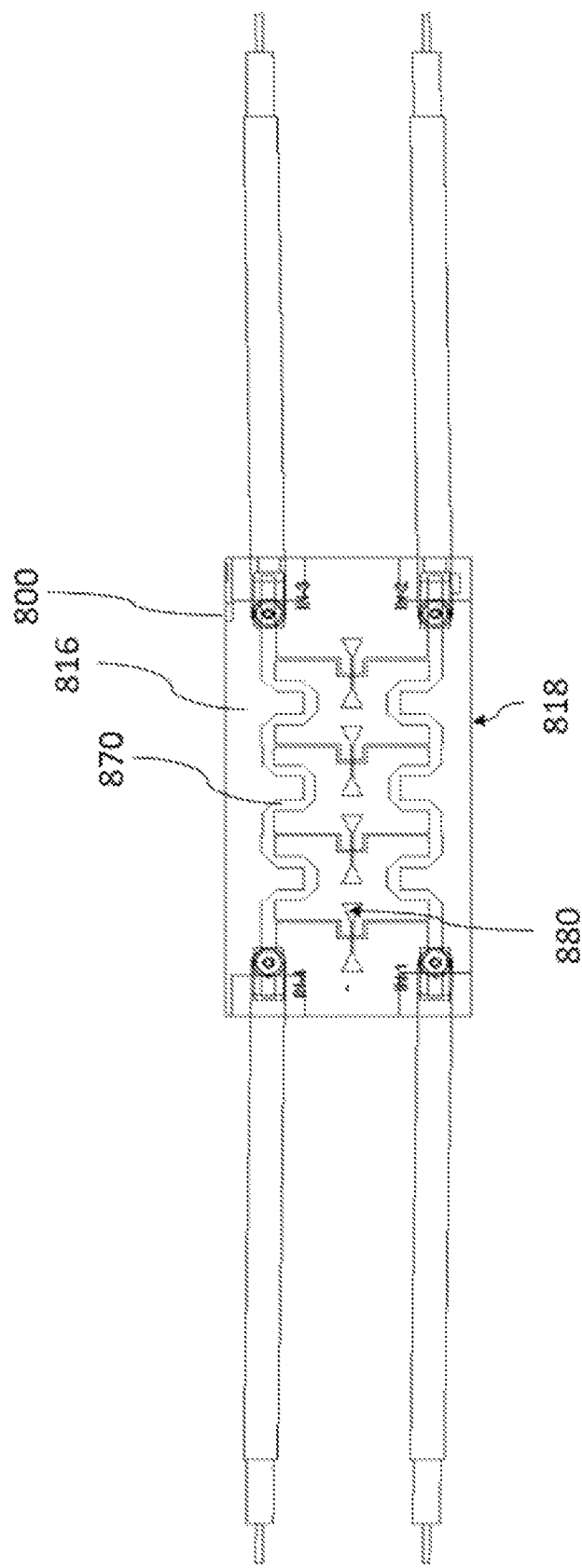
FIG. 8 is a top view of the hybrid coupler of FIG. 1 in which the first metallization layer having the transmission traces is superimposed on the second metallization layer defining the defective ground structures of a flare dumbbell shape.

In further embodiments of the present disclosure, the pre-defined shape of the defective ground structures (180) may be in a shape of a rectangle, rhombus, square, flare dumbbell, triangular dumbbell, circular dumbbell, square dumbbell or rectangular dumbbell. For instance, FIG. 5 illustrates a top view of the hybrid coupler (100) of the present disclosure, in which the first metallization layer (116) having the transmission traces (170) is superimposed on the second metallization layer (118) defining defective ground structures (180) having the shape of "rectangles", in accordance with a first embodiment of the present disclosure. FIG. 6 illustrates a top view of a hybrid coupler (600) of the present disclosure, in which a first metallization layer (616) having transmission traces (670) is superimposed on a second metallization layer (618) defining defective ground structures (680) having the shape of "rhombuses", in accordance with a second embodiment of the present disclosure. FIG. 7 illustrates a top view of a hybrid coupler (700) of the present disclosure, in which a first metallization layer (716) having transmission traces (770) is superimposed on a second metallization layer (718) defining defective ground structures (780) having the shape of "square-dumbbells", in accordance with a third embodiment of the present disclosure. FIG. 8 illustrates a top view of a hybrid coupler (800) of the present disclosure, in which a first metallization layer (816) having transmission traces (870) is superimposed on a second metallization layer (818) defining defective ground structures (880) having the shape of "flare-dumbbells", in accordance with a fourth embodiment of the present disclosure.

Figure 9:
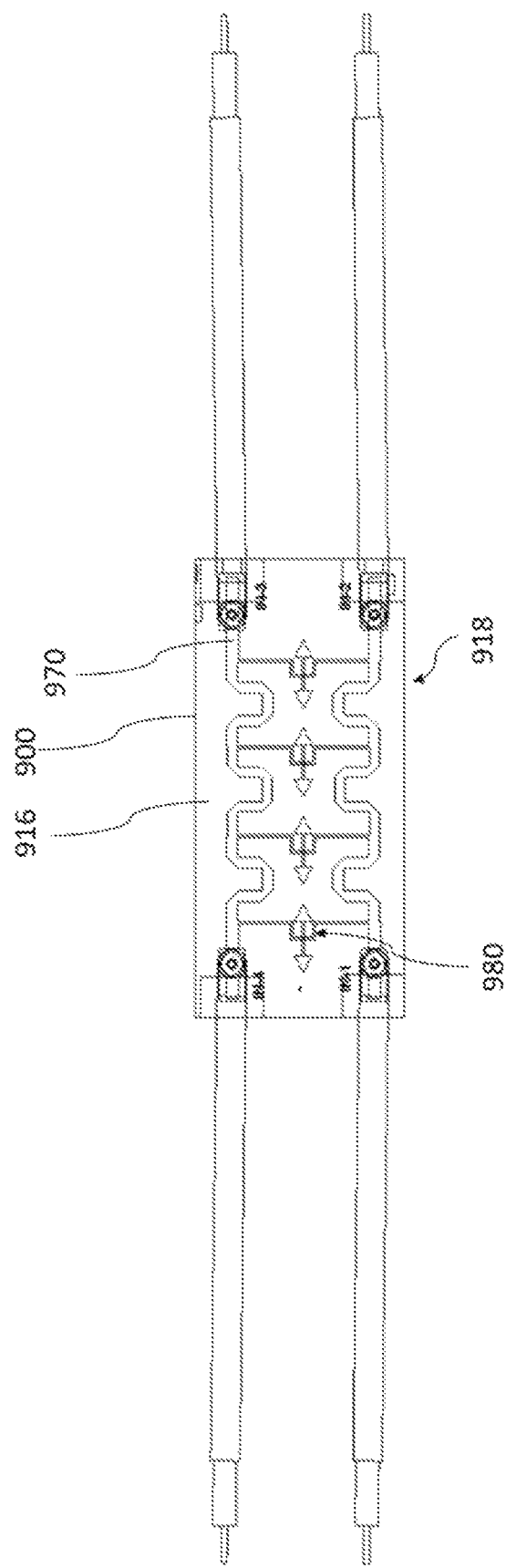
FIG. 9 is a top view of the hybrid coupler of FIG. 1 in which the first metallization layer having the transmission traces is superimposed on the second metallization layer defining the defective ground structures of a triangular dumbbell shape.
Figure 10:
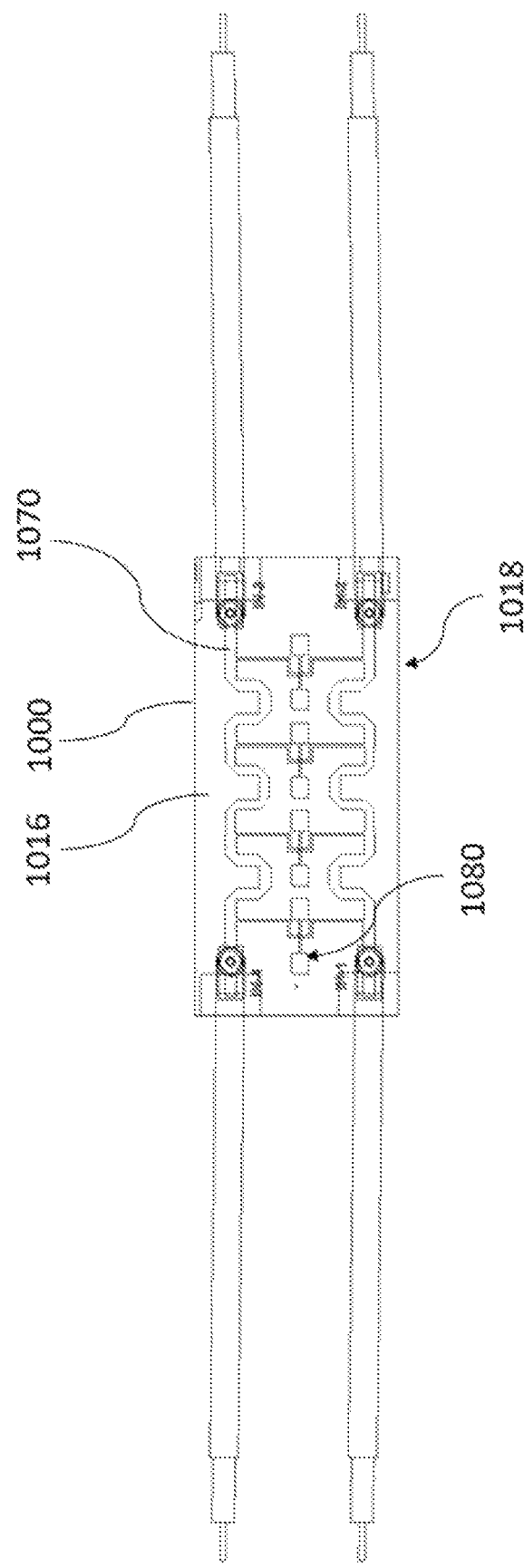
FIG. 10 is a top view of the hybrid coupler of FIG. 1 in which the first metallization layer having the transmission traces is superimposed on the second metallization layer defining the defective ground structures of a rectangle dumbbell shape.
Figure 11:
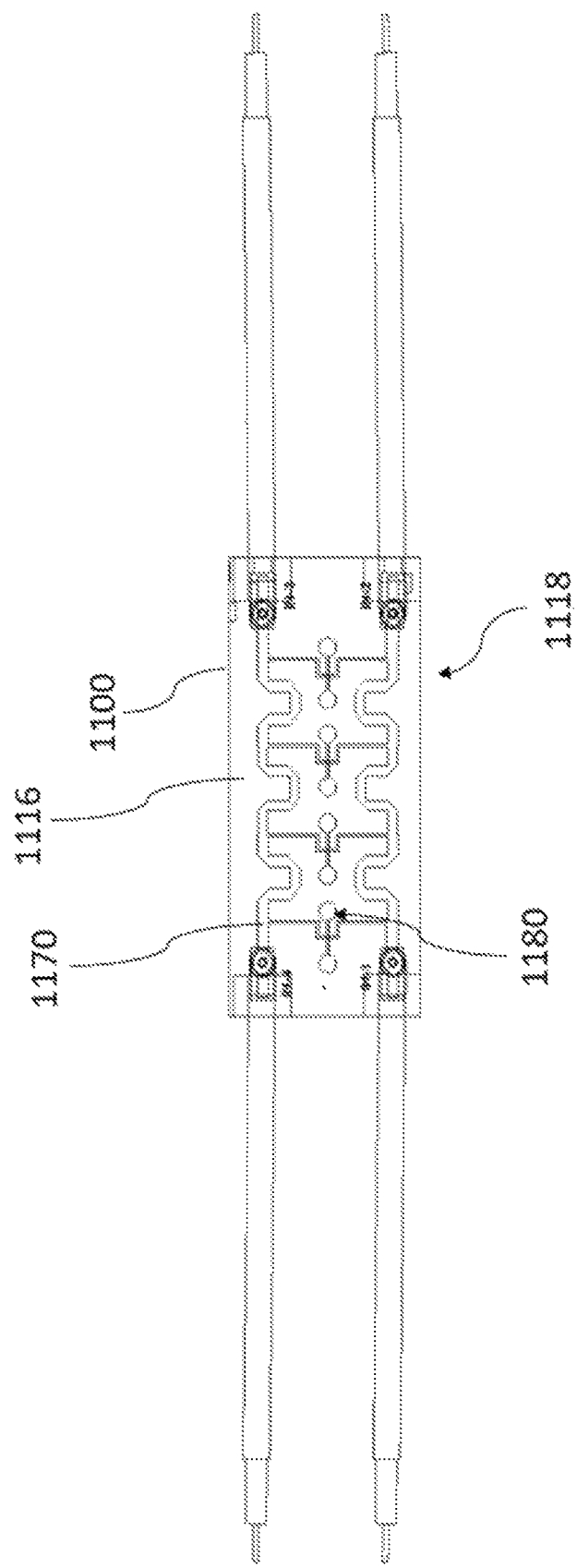
FIG. 11 is a top view of the hybrid coupler of FIG. 1 in which the first metallization layer having the transmission traces is superimposed on the second metallization layer defining the defective ground structures of a circular dumbbell shape.

Further, FIG. 9 illustrates a top view of a hybrid coupler (900) of the present disclosure, in which a first metallization layer (916) having transmission traces (970) is superimposed on a second metallization layer (918) defining defective ground structures (980) having the shape of "triangular dumbbells", in accordance with a fifth embodiment of the present disclosure. FIG. 10 illustrates a top view of a hybrid coupler (1000) of the present disclosure, in which a first metallization layer (1016) having transmission traces (1070) is superimposed on a second metallization layer (1018) defining defective ground structures (1080) having the shape of "rectangular dumbbells", in accordance with a sixth embodiment of the present disclosure. FIG. 11 illustrates a top view of a hybrid coupler (1100) of the present disclosure, in which a first metallization layer (1116) having transmission traces (1170) is superimposed on a second metallization layer (1118) defining defective ground structures (1180) having the shape of "circular dumbbells", in accordance with a seventh embodiment of the present disclosure.

Within the scope of the present disclosure, the defective ground structure (180) defined in the second metallization layer (118) facilitate in increasing the electrical length of the traces extending between the transmission traces (170) of the plurality of couplers (160). Accordingly, the hybrid coupler (100) of the present disclosure offers an increased electrical length of transmission traces (170) compared to the known hybrid couplers. Moreover, the hybrid coupler (100) of the present disclosure facilitates increasing the electrical length of the transmission traces (170) without increasing the physical length of the hybrid coupler (100). In fact, the hybrid coupler (100) of the present disclosure facilitates an increased electrical length of the transmission traces (170) with same or reduced physical length of the hybrid coupler (100). Further, the hybrid coupler (100) of the present disclosure, more output can be obtained without increasing the physical size of the phase shifter and without effecting the other performances, for example, return loss, amplitude, power distribution, etc., of the RF signals.

In accordance with the present disclosure, an increased electrical length of the traces extending between the transmission traces (170) aids in achieving uniform power distribution across a frequency band of 1.695 MHz to 2.690 MHz. In an embodiment of the present disclosure, the electrical length of the traces extending between the transmission traces (170) is 25 mm. In further embodiment of the present disclosure, the defective ground structure (180) defined in the second metallization layer (118) has a length of 9.40 mm and a width of 6.90 mm. In yet further embodiment of the present disclosure, the hybrid coupler (100) may be embodied as a 3 dB 90-degree hybrid coupler.

Further, a method for manufacturing a hybrid coupler (100) of the present disclosure is provided. The method comprises a step of designing a printed circuit board (112) having a first metallization layer (116) and a second metallization layer (118) arranged below the first metallization layer (116). The first metallization layer (116) may comprise at least two input ports (140) and at least two output ports (150). As is embodied in FIGS. 1, 2 and 5, the first metallization layer (116) comprises two input ports (140), namely first and second input ports (142, 144), and two output ports (150), namely first and second output ports (152, 154). Each of the first and second input ports (142,144) and the first and second output ports (152, 154) may be implemented as a respective conductive pad, and adapted to be soldered with centre conductors of input and output coaxial cables (120, 130) for electrical transmission and/or RF signals transmission across the hybrid coupler (100).

The method may further comprise a step of providing a plurality of couplers (160) coupled adjacent to each other on the first metallization layer (116). Each coupler (160) of the plurality of couplers (160) may comprise transmission traces (170, 172-178) adapted to be electrically coupled with the transmission traces (170, 172-178) of an adjacent coupler (160). The transmission traces (170) of the plurality of couplers (160) may further extend between the first and second input ports (142, 144) and the first and second output ports (152, 154) of the first metallization layer (116). Further, the hybrid coupler (100) may comprise a first input conductive trace (146) that connects to the first input port (142) and a second input conductive trace (148) that connects to the second input port (144). In said embodiment, the first and second input conductive traces (146, 148) may each form part of the first metallization layer (116). Within the scope of the present disclosure, the first input conductive trace (146) may form part of a first input microstrip transmission line that is implemented in the printed circuit board (112), and the second input conductive trace (148) may form part of a second input microstrip transmission line that is implemented in the printed circuit board (112). The hybrid coupler (100) may further comprise a first output conductive trace (156) that connects to the first output port (152) and a second output conductive trace (158) that connects to the second output port (154). In said embodiment, the first and second output conductive traces (156, 158) may also form part of the first metallization layer (116). The first output conductive trace (156) may form part of a first output microstrip transmission line that is implemented in the printed circuit board (112), and the second output conductive trace (158) may form part of a second output microstrip transmission line that is implemented in the printed circuit board (112). In an embodiment, the input and output transmission lines may each be implemented as meandered microstrip transmission lines. This allows the physical length of the hybrid coupler (100) to be reduced while allowing the transmission lines to have desired electrical lengths. In another embodiment, the output transmission line may include a delay line (not shown) that is incorporated into the output transmission line. As a result of the addition of the delay line, the output transmission line having the delay line is electrically longer than another output transmission line.

The method furthermore comprises a step of defining a defective ground structure (180) having a pre-defined shape in the second metallization layer (180) below each coupling junction formed between the transmission traces (170) of the plurality of couplers (160) of the first metallization layer (116). The second metallization layer (118) may comprise a ground plane layer (not shown). The ground plane layer may comprise a mostly solid layer of metal that is formed on the bottom surface of a dielectric substrate (114) of the printed circuit board. The ground plane layer may act as the ground plane for the input and output microstrip transmission lines with the dielectric substrate (114) separating the conductive traces thereof from the ground plane layer. In an embodiment, the outer conductors of the input and output coaxial cables (120, 130) may be soldered to the ground plane layer to provide a ground reference for the ground plane layer. Within the scope of the present disclosure, and with reference to FIGS. 4 and 5, the second metallization layer (118) of the printed circuit board (112) may comprise the defective ground structures (180) defined in the ground plane layer of the second metallization layer (118). In an embodiment, the defective ground structure(s) (180) may be embodied as cut-out(s) or slot(s) defined in the ground plane layer of the second metallization layer (118). In an alternate embodiment, the defective ground structure(s) (180) may be embodied as metal omitted from the ground plane layer and/or the second metallization layer (118) of the printed circuit board (112).

In accordance with the present disclosure, the hybrid coupler (100) may comprise one defective ground structure (180) formed at each coupling junction formed between the transmission traces (170) of the plurality of couplers (160). Specifically, as can be seen in FIG. 5, a first defective ground structure (182) is defined in the second metallization layer (118) below the coupling junction between the transmission traces (170) of the first coupler (162) of the first metallization layer (116), a second defective ground structure (184) is defined in the second metallization layer (118) below the coupling junction between the transmission traces (170) of the second coupler (164) of the first metallization layer (116), a third defective ground structure (186) is defined in the second metallization layer (118) below the coupling junction between the transmission traces (170) of the third coupler (166) of the first metallization layer (116), and a fourth defective ground structure (188) is defined in the second metallization layer (118) below the coupling junction between the transmission traces (170) of the fourth coupler (168) of the first metallization layer (116).

Within the scope of the present disclosure, as shown in FIGS. 4 and 5, each of the defective ground structure (180) of the second metallization layer (118) is embodied to have the pre-defined shape. The pre-defined shape may so be selected such that the said shape is suitable to reduce the insertion loss in the hybrid coupler (100) during operation of the hybrid coupler (100). In the exemplary embodiment shown in FIGS. 4 and 5, the each of the defective ground structure (180) in the second metallization layer (118) is embodied in a shape of a rectangle. In further embodiments, without deviating from the scope of the present disclosure, the pre-defined shape of the defective ground structure (180) may be in a shape of a rhombus, square, flare dumbbell, triangular dumbbell, circular dumbbell, square dumbbell or rectangular dumbbell.

The hybrid coupler (100) of the present disclosure, in which the defective ground structures (180) are defined in the second metallization layer (118) arranged below the first metallization layer (116) having the plurality of couplers (160), eliminates the need of adding Xinger IC(s) in the coupler assembly and offers equal power distribution in the hybrid coupler (100). Also, the hybrid coupler (100) of the present disclosure provides increased bandwidth, optimized power distribution and reduced manufacturing costs as compared to the conventional known hybrid couplers. Moreover, the hybrid coupler (100) of the present disclosure is embodied as a wideband 3-dB quadrature coupler that can operate between 1.695-2.690 GHz, and provides the technical advantages of high power, 0.2 dB of insertion loss, return loss of better than 18 dB, and isolation of better than 25 dB in the frequency range from 1.695 to 2.69 GHz.

Figure 12:
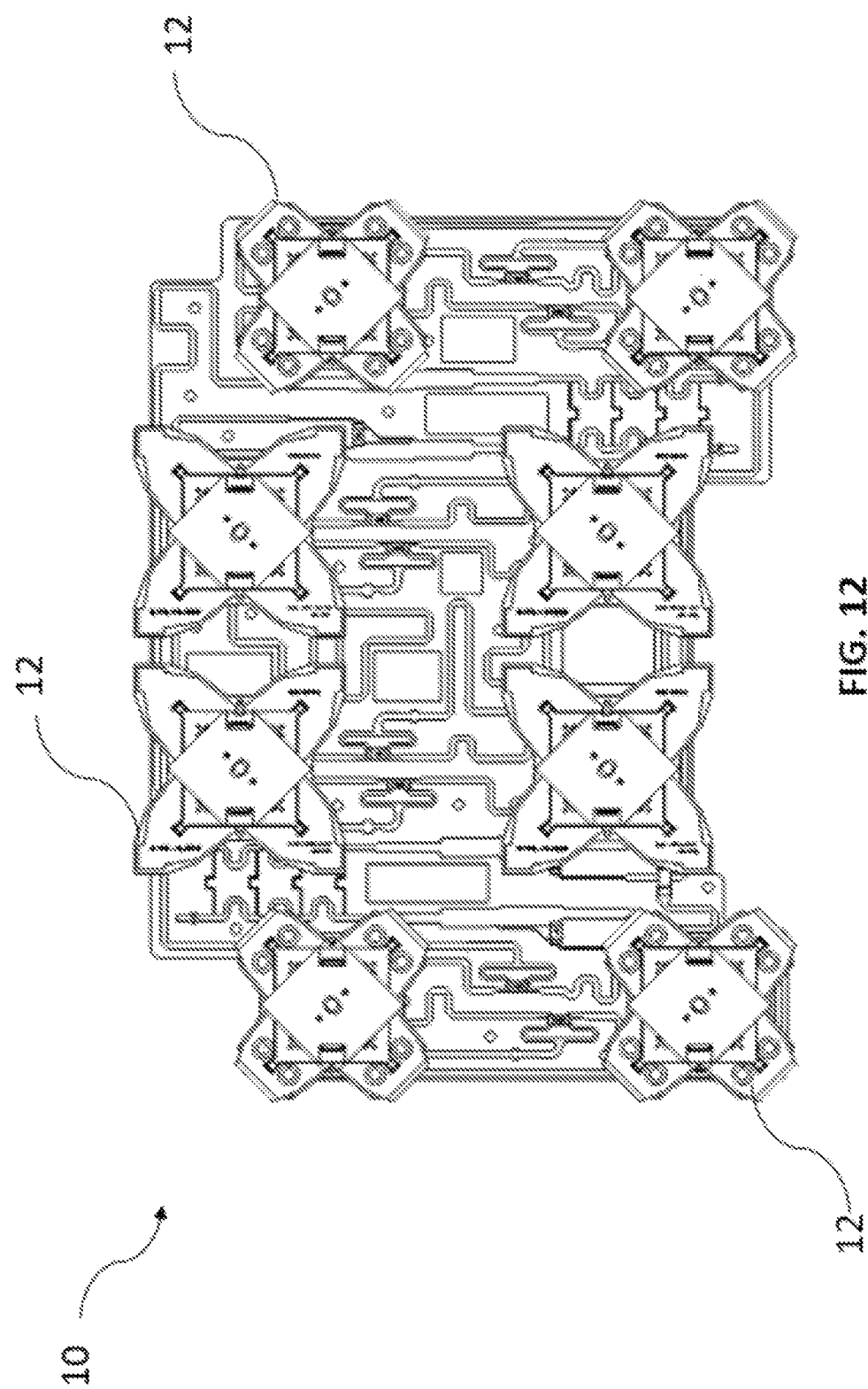
FIG. 12 illustrates a staggered arrangement of radiating elements (of a twin-beam antenna) that may be electrically coupled to the hybrid coupler, in accordance with an embodiment of the present disclosure.
Figure 13:
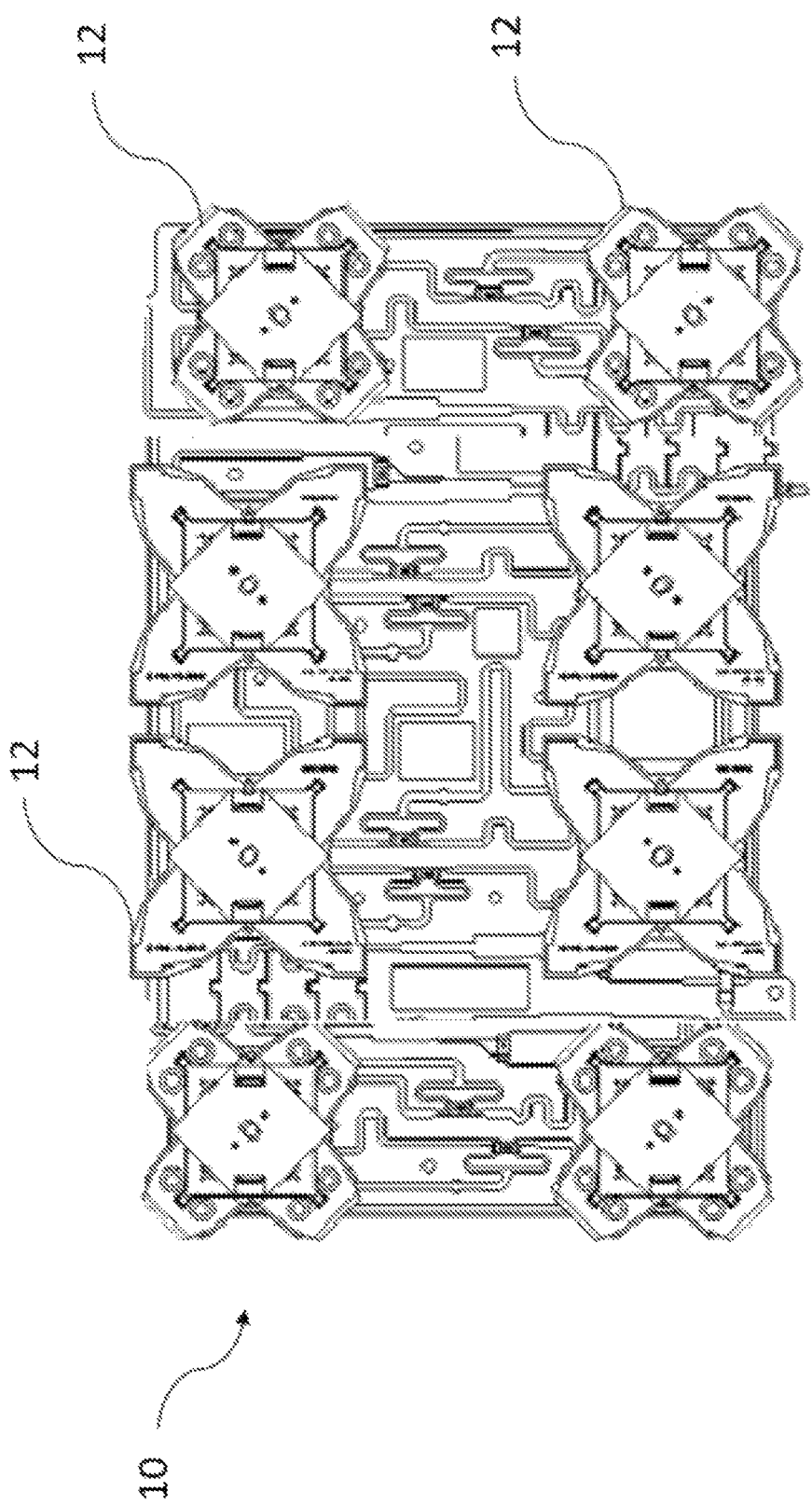
FIG. 13 illustrates a staggered arrangement of the radiating elements that may be electrically coupled to the hybrid coupler, in accordance with another embodiment of the present disclosure.

Without deviating from the scope of the present disclosure, the hybrid coupler (100) of the present disclosure is adapted to be integrated in a feed board for twin-beam antennas (10). For instance, the hybrid coupler (100) discussed above may be mounted on a reflector of the twin-beam antenna (10) and the metal of the reflector may provide a ground plane reference underneath the hybrid coupler (100). Further, a plurality of radiating elements (12) may be mounted on the printed circuit board 112 of the hybrid coupler (100) so that printed circuit board (112) is used to implement both the hybrid coupler (100) and the feed board for the radiating elements (12). As shown in FIGS. 12 and 13, in some embodiments, the radiating elements (12) may be arranged in a staggered manner. According to embodiments of the twin-beam antenna (10), the staggered arrangement of the radiating elements (12) may comprise a horizontal layout, a vertical layout, an offset layout, or a combination layout thereof, of the radiating elements (12). As illustrated in exemplary embodiment of FIG. 12, the twin-beam antenna (10) may comprise the radiating elements (12) arranged in an offset layout. Also, as illustrated in exemplary embodiment of FIG. 13, the twin-beam antenna (10) may comprise the radiating elements (12) arranged in an array of radiating elements (12) having a combination of horizontal and vertical layouts. The staggered arrangement of the radiating elements (12) may facilitate increasing isolation between adjacent columns of radiating elements and/or increasing the gain of the twin-beam antenna (10).

The various embodiments of the present disclosure have been described above with reference to the accompanying drawings. The present disclosure is not limited to the illustrated embodiments; rather, these embodiments are intended to fully and completely disclose the subject matter of the disclosure to those skilled in this art. In the drawings, like numbers refer to like elements throughout. Thicknesses and dimensions of some components may be exaggerated for clarity.

Spatially relative terms, such as "under," "below," "lower," "over," "upper," "top," "bottom" and the like, may be used herein for ease of description to describe one element or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

Herein, the terms "attached," "connected," "interconnected," "contacting," "mounted," "coupled" and the like can mean either direct or indirect attachment or contact between elements, unless stated otherwise.

Well-known functions or constructions may not be described in detail for brevity and/or clarity. As used herein the expression "and/or" includes any and all combinations of one or more of the associated listed items.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises," "comprising," "includes" and/or "including" when used in this specification, specify the presence of stated features, operations, elements, and/or components, but do not preclude the presence or addition of one or more other features, operations, elements, components, and/or groups thereof.

While considerable emphasis has been placed herein on the particular features of this disclosure, it will be appreciated that various modifications can be made, and that many changes can be made in the preferred embodiments without departing from the principles of the disclosure. These and other modifications in the nature of the disclosure or the preferred embodiments will be apparent to those skilled in the art from the disclosure herein, whereby it is to be distinctly understood that the foregoing descriptive matter is to be interpreted merely as illustrative of the disclosure and not as a limitation.

REFERENCE NUMERALS

| PARTICULARS | REFERRAL NUMERAL |
|---|---|
| Twin-Beam Antenna | 10 |
| Radiating Elements | 12 |
| Hybrid Coupler | 100 |
| Printed Circuit Board | 112 |
| Dielectric Substrate | 114 |
| First Metallization Layer | 116 |
| Second Metallization Layer | 118 |
| Input Coaxial Cables | 120 |
| Output Coaxial Cables | 130 |
| Input Ports | 140 |
| First Input Port | 142 |
| Second Input Port | 144 |
| First Input Conductive Trace | 146 |
| Second Input Conductive Trace | 148 |
| Output Ports | 150 |
| First Output Port | 152 |
| Second Output Port | 154 |
| First Output Conductive Trace | 156 |
| Second Output Conductive Trace | 158 |
| Plurality of Couplers | 160 |
| First Coupler | 162 |
| Second Coupler | 164 |
| Third Coupler | 166 |
| Fourth Coupler | 168 |
| Transmission Traces | 170 |
| Transmission Trace | 172 |
| Transmission Trace | 174 |
| Transmission Trace | 176 |
| Transmission Trace | 178 |
| Defective Ground Structures | 180 |
| First Defective Ground Structure | 182 |
| Second Defective Ground Structure | 184 |
| Third Defective Ground Structure | 186 |
| Fourth Defective Ground Structure | 188 |
| Hybrid Coupler | 600 |
| First Metallization Layer | 616 |
| Second Metallization Layer | 618 |
| Transmission Traces | 670 |
| Defective Ground Structures | 680 |
| Hybrid Coupler | 700 |
| First Metallization Layer | 716 |
| Second Metallization Layer | 718 |
| Transmission Traces | 770 |
| Defective Ground Structures | 780 |
| Hybrid Coupler | 800 |
| First Metallization Layer | 816 |
| Second Metallization Layer | 818 |
| Transmission Traces | 870 |
| Defective Ground Structures | 880 |
| Hybrid Coupler | 900 |
| First Metallization Layer | 916 |
| Second Metallization Layer | 918 |
| Transmission Traces | 970 |
| Defective Ground Structures | 980 |
| Hybrid Coupler | 1000 |
| First Metallization Layer | 1016 |
| Second Metallization Layer | 1018 |
| Transmission Traces | 1070 |
| Defective Ground Structures | 1080 |
| Hybrid Coupler | 1100 |
| First Metallization Layer | 1116 |
| Second Metallization Layer | 1118 |
| Transmission Traces | 1170 |
| Defective Ground Structures | 1180 |

EQUIVALENTS

The embodiments herein and the various features and advantageous details thereof are explained with reference to the non-limiting embodiments in the description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the embodiments as described herein.

Throughout this specification the word "comprise," or variations such as "comprises" or "comprising," will be understood to imply the inclusion of a stated element, integer or step, or group of elements, integers or steps, but not the exclusion of any other element, integer or step, or group of elements, integers or steps.

The use of the expression "at least" or "at least one" suggests the use of one or more elements or ingredients or quantities, as the use may be in the embodiment of the disclosure to achieve one or more of the desired objects or results.

Any discussion of documents, acts, materials, devices, articles and the like that has been included in this specification is solely for the purpose of providing a context for the disclosure. It is not to be taken as an admission that any or all of these matters form a part of the prior art base or were common general knowledge in the field relevant to the disclosure as it existed anywhere before the priority date of this application.

The numerical values mentioned for the various physical parameters, dimensions or quantities are only approximations and it is envisaged that the values higher/lower than the numerical values assigned to the parameters, dimensions or quantities fall within the scope of the disclosure, unless there is a statement in the specification specific to the contrary.

What is claimed is:

1. A hybrid coupler, comprising:
   a printed circuit board having a first metallization layer and a second metallization layer arranged below the first metallization layer, the first metallization layer comprising at least two input ports and at least two output ports;
   a plurality of couplers coupled adjacent to each other on the first metallization layer, each coupler of the plurality of couplers comprises transmission traces electrically coupled with the transmission traces of an adjacent coupler and the transmission traces of the plurality of couplers extend between the input ports and the output ports of the first metallization layer; and
   a defective ground structure having a pre-defined shape defined in the second metallization layer below at least one coupling junction formed between the transmission traces of the plurality of couplers.

2. The hybrid coupler as claimed in claim 1, wherein the pre-defined shape of the defective ground structure is in shape of a rectangle, rhombus, square, flare dumbbell, triangular dumbbell, circular dumbbell, square dumbbell or rectangular dumbbell.

3. The hybrid coupler as claimed in claim 1, wherein the hybrid coupler comprises four coupler units on the first metallization layer.

4. The hybrid coupler as claimed in claim 1, wherein the defective ground structure is configured to increase an electrical length of traces extending between the transmission traces for achieving uniform power distribution across a frequency band of 1.695 MHz to 2.690 MHz.

5. The hybrid coupler as claimed in claim 4, wherein the electrical length of traces extending between the transmission traces is 25 mm.

6. The hybrid coupler as claimed in claim 1, wherein the defective ground structure has a length of 9.40 mm and a width of 6.90 mm.

7. The hybrid coupler as claimed in claim 1, wherein the hybrid coupler is a 3 dB 90-degree hybrid coupler.

8. The hybrid coupler as claimed in claim 1, wherein the defective ground structure comprises one or more cut-outs defined in a ground plane layer of the second metallization layer.

9. A method of manufacturing a hybrid coupler, the method comprising:
   designing a printed circuit board having a first metallization layer and a second metallization layer arranged below the first metallization layer, the first metallization layer comprising at least two input ports and at least two output ports;
   providing a plurality of couplers coupled adjacent to each other on the first metallization layer, each coupler of the plurality of couplers comprises transmission traces electrically coupled with the transmission traces of an adjacent coupler and the transmission traces of the plurality of couplers extend between the input ports and the output ports of the first metallization layer; and
   defining a defective ground structure having a pre-defined shape in the second metallization layer below at least one coupling junction formed between the transmission traces of the plurality of couplers.

10. The method as claimed in claim 9, wherein defining the defective ground structure in the pre-defined shape comprises defining the defective ground structure in a shape of a rectangle, rhombus, square, flare dumbbell, triangular dumbbell, circular dumbbell, square dumbbell or rectangular dumbbell.

11. A twin bean twin-beam antenna comprising:
    a hybrid coupler adapted to mount radiating elements thereon, the hybrid coupler comprising:
      a printed circuit board having a first metallization layer and a second metallization layer arranged below the first metallization layer, the first metallization layer comprising at least two input ports and at least two output ports;
      a plurality of couplers coupled adjacent to each other on the first metallization layer, each coupler of the plurality of couplers comprises transmission traces electrically coupled with the transmission traces of an adjacent coupler and the transmission traces of the plurality of couplers extend between the input ports and the output ports of the first metallization layer; and
      a defective ground structure having a pre-defined shape defined in the second metallization layer below at least one coupling junction formed between the transmission traces of the plurality of couplers.

12. The twin-beam antenna as claimed in claim 11, wherein the pre-defined shape of the defective ground structure is in a shape of a rectangle, rhombus, square, flare dumbbell, triangular dumbbell, circular dumbbell, square dumbbell or rectangular dumbbell.

13. The twin-beam antenna as claimed in claim 11, wherein the hybrid coupler comprises four coupler units on the first metallization layer.

14. The twin-beam antenna as claimed in claim 11, wherein the defective ground structure is configured to increase an electrical length of traces extending between the transmission traces for achieving uniform power distribution across a frequency band of 1.695 MHz to 2.690 MHz.

15. The twin-beam antenna as claimed in claim 14, wherein the electrical length of the traces extending between the transmission traces is 25 mm.

16. The twin-beam antenna as claimed in claim 11, wherein the defective ground structure has a length of 9.40 mm and width of 6.90 mm.

17. The twin-beam antenna as claimed in claim 11, wherein the hybrid coupler is a 3 dB 90-degree hybrid coupler.

18. The twin-beam antenna as claimed in claim 11, wherein the radiating elements are arranged in a staggered arrangement.

19. The twin-beam antenna as claimed in claim 18, wherein the staggered arrangement of the radiating elements comprises horizontal layout, vertical layout, offset layout, or a combination layout thereof, of the radiating elements.

20. The twin-beam antenna as claimed in claim 11, wherein the defective ground structure comprises one or more cut-outs defined in a ground plane layer of the second metallization layer.

* * * * *

UNITED STATES PATENT AND TRADEMARK OFFICE
CERTIFICATE OF CORRECTION

PATENT NO. : 12,027,745 B2
APPLICATION NO. : 18/333655
DATED : July 2, 2024
INVENTOR(S) : Yeddula et al.

It is certified that error appears in the above-identified patent and that said Letters Patent is hereby corrected as shown below:

In the Claims

Column 18, Line 45, Claim 11: Please correct "twin bean twin-beam" to read --twin-beam--

Signed and Sealed this
Third Day of September, 2024

Katherine Kelly Vidal
*Director of the United States Patent and Trademark Office*